United States Patent [19]

Cooper

[11] Patent Number: 5,375,129
[45] Date of Patent: Dec. 20, 1994

[54] MAXIMUM LIKELIHOOD SEQUENCE DETECTOR

[75] Inventor: Andrew Cooper, Wokingham, England

[73] Assignee: Technophone Limited, Surrey, England

[21] Appl. No.: 731,854

[22] Filed: Jul. 16, 1991

[30] Foreign Application Priority Data

Jul. 19, 1990 [GB] United Kingdom ............... 9015854

[51] Int. Cl.$^5$ .................... G06F 11/10; H03M 13/12
[52] U.S. Cl. ........................................ 371/43; 375/11; 375/94
[58] Field of Search .............. 371/43, 44, 45, 39; 375/94, 11, 39, 42, 96; 360/44, 48, 65

[56] References Cited

U.S. PATENT DOCUMENTS

| | | | |
|---|---|---|---|
| 4,573,155 | 2/1986 | Currie et al. | 371/37 |
| 4,675,871 | 6/1987 | Gordon et al. | 371/43 |
| 4,730,322 | 3/1988 | Pollara-Bozzola | 371/43 |
| 4,797,887 | 1/1989 | Yamasaki et al. | 371/43 |
| 4,805,174 | 2/1989 | Kubota et al. | 371/43 |
| 4,847,871 | 7/1989 | Matsushita et al. | 371/43 |
| 4,932,029 | 6/1990 | Heichler | 371/43 |
| 4,941,154 | 7/1990 | Wei | 371/43 |
| 4,945,538 | 7/1990 | Patel | 371/43 |

FOREIGN PATENT DOCUMENTS

| | | | |
|---|---|---|---|
| 0302330 | 7/1988 | European Pat. Off. .... H03M 13/12 |
| 0398690 | 11/1990 | European Pat. Off. . |
| 1478736A | 4/1975 | United Kingdom . |

OTHER PUBLICATIONS

Proceedings of the IEEE International Conference on Communications 1989, 11–14th Jun. 1989, Boston, U.S.; IEEE, New York, U.S., 1989; pp. 1096–1100, Thapar and Cioffi: "A block processing method for designing high-speed Viterbi detectors".
Fourth Joint Swedish–Soviet International Workshop on Information Theory, Gotland, SE, Aug. 1989; pp. 29–33, Hagenauer and Hoeher: "Concatenated Viterbi-Decoding".
IEEE Transactions on Cummunication Technology. vol. 38, No. 8, Aug. 1990, New York US, pp. 1138–1144. Paaske 'Improved decoding for a concatenated coding system recommended by CCSDS'.

*Primary Examiner*—Robert W. Beausoliel, Jr.
*Assistant Examiner*—Phung Chung
*Attorney, Agent, or Firm*—Perman & Green

[57] ABSTRACT

A maximum likelihood detector using the Viterbi algorithm for estimating a sequence of data bits received over a communication channel. Depending on the constraint length (C), a plurality of different states is associated with the transmitted bits (e.g. 16 if C=4). The detector comprises various data sources relating respectively to state transition probabilities (branch metrics, previous partial path metrics) and observed values of the received bits. Means are provided for calculating the partial path metrics for each state using values from said data sources. The calculating means comprise a common adder/accumulator for performing repeated additive arithmetic operations and for storing the cumulative result thereof. Multiplexing means are also provided for selectively coupling the data sources in a predetermined order to the adder/accumulator to implement the partial path metric calculation. The architecture is compatible with VLSI techniques and enables the detector to be implemented using minimal semiconductor area. The detector may be used independently as an equaliser or a decoder but in a preferred embodiment both these functions re-use the same common hardware in series enabling both the equaliser and decoder to be implemented in a single integrated circuit (i.e. on one 'chip').

64 Claims, 7 Drawing Sheets

MAXIMUM LIKELIHOOD SEQUENCE DETECTOR

This invention relates to a maximum likelihood (ML) detector for estimating a data symbol in a sequence of transmitted data symbols received over a communication channel, and further relates to an equaliser and/or decoder incorporating such a detector.

In the present specification digitised signals are referred to as data.

BACKGROUND OF THE INVENTION

Intersymbol interference is a recognised problem resulting from transmission of data on a dispersive communication channel and an equalisation process is effected on the received signal in order to estimate the individual data symbols which were originally transmitted. Various types of equaliser are known but of particular interest in the present context are so-called maximum likelihood (ML) detectors.

Furthermore, for the purpose of forward error correction, data may be convolutionally encoded before it is transmitted. (Forward error correction means that the data is corrected at the receiver without the need for retransmission.) A ML detector may also be used for decoding convolutionally encoded data.

In the context of ML detection, a trellis diagram is commonly used to represent the progression of states with the passage of time. It is noted here that the number of states S is given by the equation $S=N^c$ where N is the number of symbols in the data alphabet used and C is the constraint length (i.e. extent of intersymbol interference). Thus for a 2-symbol alphabet and a constraint length of 4 there are 16 possible states.

The term 'node' is usually used to designate a particular state at a particular time on a trellis diagram.

The arc or path representing the transition between two states (nodes) adjacent in time is known as a 'branch' and the associated 'branch metric' is an indication of the likelihood of the particular transition occurring. The 'partial path metric' is the overall probability that a particular partial path to the left of the node at the current stage n of the trellis represents the correct sequence of state transitions, taking into account the observed sample of the received data at the current trellis transition and the branch metric. The term 'partial path' is construed accordingly. This is the meaning of the terms partial path and partial path metric as they are used in the present specification, but the terms 'path' and 'path metric' are also used to convey the same meaning. The 'previous partial path metric' thus refers to the path metric at the previous stage $n-1$ of the trellis. The overall path i.e. the path between the beginning and the end of the trellis which has the maximum path metric is the maximum likelihood path which essentially represents the best estimate of the data symbols actually transmitted.

In theory a maximum likelihood (ML) or maximum a-posteriori (MAP) detector may be used wherein the branch metrics are calculated for every branch in the trellis diagram. The path metric for every path in the trellis diagram is then determined, and finally the path for which the overall path metric is a maximum is chosen. The sequence of symbols corresponding to this path is the estimate of the symbols actually transmitted. The difficulty with this approach is that the number of paths increases exponentially as the trellis diagram is traversed from left to right.

The so-called Viterbi detector is a computationally more efficient version of a ML detector which exploits the special structure of the detector to achieve a complexity that grows linearly rather than exponentially along the trellis. Hence, a Viterbi detector has the advantage that it requires a constant computation rate per unit time. For each node, the Viterbi detector selects the path having the largest partial path metric, called the 'survivor path' for that node. All partial paths other than the survivor path are discarded because any other partial path has by definition a smaller partial path metric, and hence if it replaced the survivor path in any overall path, the path metric would be smaller.

At each stage of the trellis it is not known which node the optimal path must pass through and so it is necessary to retain one survivor path for each and every node. The survivor path and associated path metric have to be stored in memory for each node at a stage n in the trellis in order for the algorithm to proceed to the next stage $n+1$.

When the terminal node of the trellis has been reached it is possible to determine the unique path of maximum likelihood representing the estimation of the symbols actually transmitted. It is only at this stage that the estimated data symbols can be read off by effecting a "trace-back" along the identified maximum likelihood path.

Despite its improved efficiency mentioned above, it has to be noted the Viterbi algorithm remains intrinsically computationally elaborate and therefore the processing circuitry for implementing the algorithm tends to be complex, costly and power consuming. Furthermore, the level of complexity means that a substantial area of semiconductor material is required for realization of a conventional Viterbi detector in integrated circuit (IC) form.

European Patent Application No. 0,398,690, which was published after the priority date of the subject application, relates to circuitry for implementing the Viterbi algorithm, wherein the states of the bits of a defined time interval are processed utilizing the circuitry in serial form for indicating the data symbol.

SUMMARY OF THE INVENTION

According to the present invention there is provided a maximum likelihood (ML) detector for estimating a data symbol in a sequence of transmitted data symbols received over a communication channel, wherein a plurality of different states is associated with the transmission of said data symbols, the detector comprising a plurality of data sources relating respectively to state transition probabilities and observed values of the received data symbols, and means for calculating the partial path metrics for each state using values from said data sources, characterised in that the calculating means comprise common add/accumulate means for performing repeated additive arithmetic operations and for storing the cumulative result thereof, and in that multiplexing means are provided for selectively coupling said data sources in a predetermined order to said add-/accumulate means to implement the partial path metric calculation.

A ML detector in accordance with the invention has the advantage that, by time multiplexing, the same processing circuitry, viz. the add/accumulate means, can be used repeatedly to perform all of the arithmetic steps required to calculate the partial path metrics. Since no further arithmetic processing means are required, the hardware complexity is dramatically reduced and consequently the detector can be implemented in integrated circuit form using significantly less semiconductor (e.g. silicon) area.

The ML detector may include a further data source relating to terms characteristic of the communication channel, and means for calculating the branch metrics using values from said further data source and from the data source relating to the observed values of the received data symbols, wherein the branch metric calculating means comprise said common add/accumulate means, the multiplexing means being adapted for selectively coupling said data sources in a predetermined order to said common add/accumulate means to implement the branch metric calculations. Hence, the same add/accumulate means are used, again by time multiplexing, also to calculate the branch metrics. Clearly, this arrangement further helps to reduce hardware complexity by maximising re-use of the same add/accumulate means.

In one embodiment the predetermined order in which the multiplexing means couples the data sources to the add/accumulate means is such that for each state at a given time a first partial path metric is calculated in respect of a state transition corresponding to the transmission of a first symbol type (e.g. a binary "1"), and subsequently a second partial path metric is calculated in respect of a state transition corresponding to the transmission of a second symbol type (e.g. a binary "0"), means being provided for storing said first partial path metric, the detector further including means for comparing the first partial path metric in the storage means and the second partial path metric in the add/accumulate means and for selecting the larger of said first and second partial path metrics for each state in turn. In this case only a single adder/accumulator is required to implement the arithmetic processing in a complete Viterbi processor.

In an alternative embodiment the calculating means comprises a first add/accumulate means for calculating for each state in turn a first partial path metric in respect of a state transition corresponding to the transmission of a first symbol type (e.g. a binary "1"), and a second add/accumulate means for calculating for each state in turn a second partial path metric in respect of a state transition corresponding to the transmission of a second symbol type (e.g. a binary "0"). Suitably the first and second add/accumulate means are arranged to operate in parallel. This arrangement has the advantage of reducing processing time (because the two partial path metrics associated with a given state can be calculated simultaneously), but at the expense of an including an additional add/accumulate means. On the other hand, this arrangement does dispense with the additional storage means for storing the first partial path metric required in the previous embodiment. Means may also be included for comparing the first and second partial path metrics in said first and second add/accumulate means respectively and for selecting the larger of said first and second partial path metrics for each state.

In order to implement the Viterbi algorithm in either of the aforementioned embodiments, means are preferably included for storing the larger of the first and second partial path metrics for each state. In addition, means may be provided for storing for each state either a first or a second symbol (e.g. a "1" or a "0", viz. a so-called survivor bit) depending on which of the first and second partial path metrics is the larger. Means may be provided for reading from the data symbol storage means an estimate of the most likely sequence of transmitted data symbols. This reading step is commonly known in the art as "trace-back".

It is noted here that a maximum likelihood detector in accordance with the invention may be utilised in an equaliser and/or a decoder.

It is particularly advantageous not only that the same adder/accumulator can be used repeatedly within the equalisation and decoding functions, but also that the same adder/accumulator can be re-used by multiplexing in such manner that the same detector functions sequentially both as the equaliser and as the decoder. This has important implications in practice because both the equaliser and the decoder can be realised on a unitary IC (i.e. on a single "chip"). In this case the same Viterbi processor can effectively be time-shared by the respective equalisation and decoding functions.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

Figure 1:
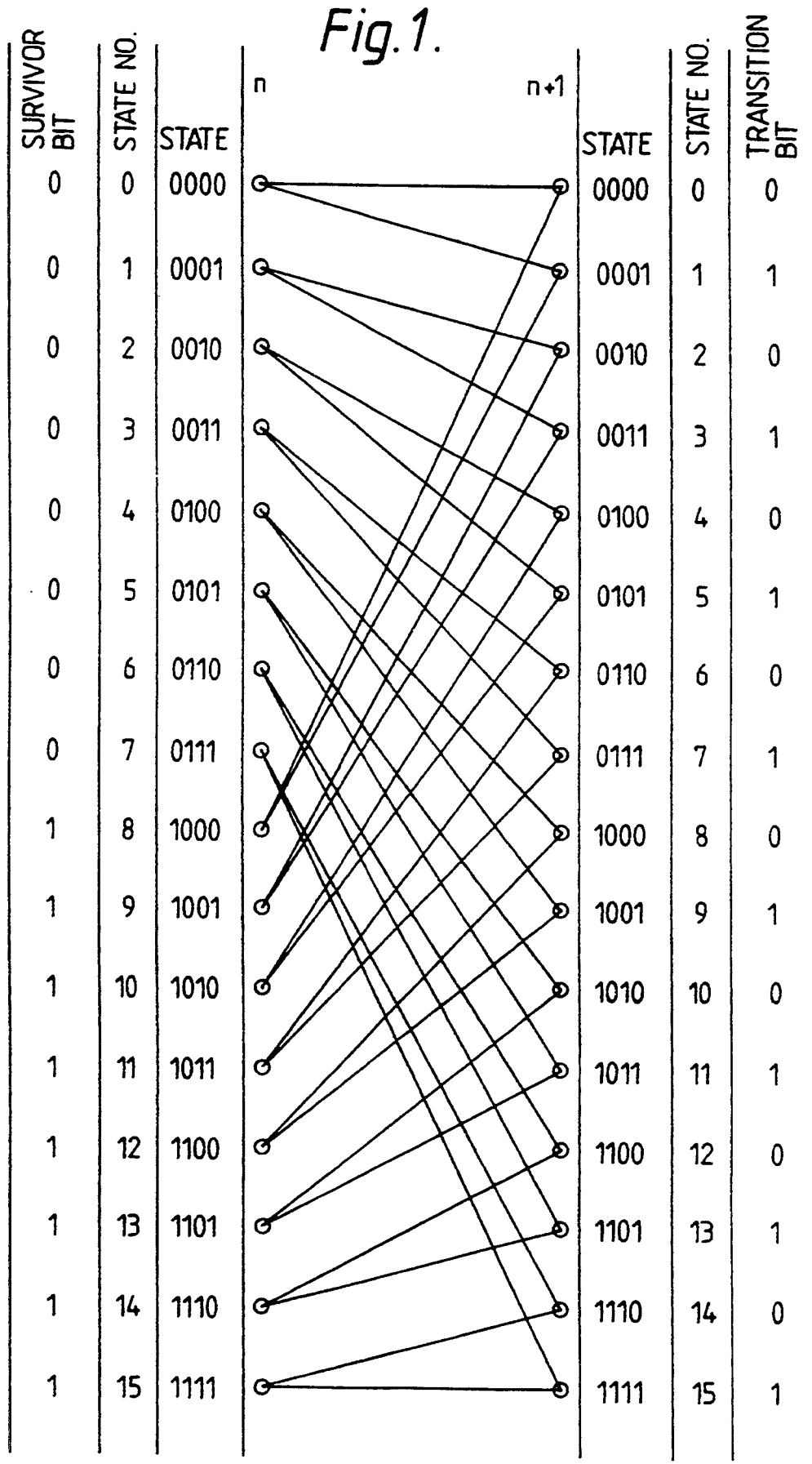
FIG. 1 is a part of a 16-state trellis diagram illustrating the possible state transitions.

FIG. 1 is part of a trellis diagram for the 16 states associated with a 2-symbol alphabet in the case where the constraint length is 4. The two symbols may, for example, be +1 and −1 mapped from the single bits 1 and 0 respectively. The partial trellis diagram shows the state transitions for all 16 states at a stage n and a subsequent stage n+1.

The states (0000, 0001 ... 1110, 1111) are indicated in columns to the left and right of the respective nodes of the actual trellis diagram and the number of the state is shown in the column adjacent the state.

A transition between states occurs by shifting the current state at stage n one bit to the left, inserting the so-called transition bit in the position of the least significant bit and discarding the most significant bit (known as the survivor bit). The survivor bit is shown separately in the left hand (first) column in FIG. 1 and the transition bit is shown in the right hand (last) column.

As will be discussed in more detail below, the partial path metric for any particular state 0 to 15 at stage n+1 is given by combining the previous partial path metric at stage n and the branch metric between stages n and n+1. It can be seen that for each node at stage n+1 two possible state transitions may have occurred, that is to say there are two branch metrics. Hence there are two partial path metrics associated with each node, the larger of which is retained as the survivor path in accordance with the Viterbi algorithm. The survivor path is a unique path through the trellis which indicates the most likely sequence of state transitions terminating at any particular node. A 1 or a 0 is retained as a survivor bit depending on the most significant bit of the previous state in the survivor path. Hence consider the state number 1, i.e. 0001, at stage n+1. There are two possible states at the preceding stage n which could lead to state 0001 at stage n+1, namely state number 0 (0000) and state number 8 (1000). It can be seen from FIG. 1 that if the survivor path shows the last transition was from state 0 then the survivor bit is 0, whereas if the survivor path shows the last transition was from state 8 then the survivor bit is 1.

In general there are $2^{c+1}$ possible paths at each trellis transition, where C is the constraint length. In the present case where C=4 there are $2^5=32$ paths through the trellis. That is to say that at any stage in the trellis there are 32 possible paths associated with the 16 states, i.e. 2 paths per state as can be seen from FIG. 1. Hence there are 32 path metrics to be calculated at each stage in the trellis. However, only $2^c$ (in this case 16) paths are retained (survived) at each trellis stage.

The partial path metric is dependant not only on the previous partial path metric and the branch metric (as mentioned above), but also on the current observation or sample value of the received data symbol. The closer the observation is to the expected data symbol the more likely it is that the associated state transition actually occurred. Conversely the more the observed value departs from the expected data symbol the less certain it is that the associated state transition actually occurred. Using the equation derived by Gottfried Ungerboeck in his paper entitled "Adaptive Maximum-Likelihood Receiver for Carrier-Modulated Data-Transmission Systems" published in IEEE Transactions on Communications, Vol. COM-22, No. 5, May 1974, pages 624–636, and using the same nomenclature adopted therein, the partial path metric $J_n$ at stage n is defined by $$J_n = 2 \cdot a_n \cdot obs + max\{J_{n-1} - F(\sigma_n, \sigma_{n-1})\} \quad (1)$$

where $a_n$ is the least significant bit of the current state (i.e. the transition bit, hence for the state transition 0000 to 0001 $a_n=1$), obs is the external observation of the received data for the current trellis transition, $J_{n-1}$ is the value of the previous partial path metric and $F(\sigma_n, \sigma_{n-1})$ is the branch metric where $\sigma$ refers to the state; $\sigma_n$ being the current state, and $\sigma_{n-1}$ being the previous state. The $2^{c+1}$ branch metrics are determined by the following formula:

$$F(\sigma_n, \sigma_{n-1}) = a_n^2 s_0 + 2a_n \sum_{i=1}^{c} a_{n-i} s_i \quad (2)$$

where the s values are provided from estimates of the channel characteristics (i.e. the channel impulse response), and the $a_i$ values relate to the previous and current states. Hence $a_n$ is the new bit in the sequence (the transition bit) and $a_{n-i}$ (i=1 ... C) are the bits of the previous state. Hence for the transition 0110 to 1101 $a_n=1$, $a_{n-1}=0$, $a_{n-2}=1$, $a_{n-3}=1$, $a_{n-4}=0$.

The 'a' values can be mapped from (0,1) to (−1,1). (If zero was used, all the 's' values multiplied by zero in equation (2) above would have the same weight, namely zero).

Hence the equation for the branch metrics, in the case of a 16 state trellis (i.e. C=4) becomes:

$$F(\sigma_n, \sigma_{n-1}) = s_0 \pm 2s_1 \pm 2s_2 \pm 2s_3 \pm 2s_4 \quad (3)$$

The branch metrics, according to this equation, remain constant throughout the trellis. They can therefore be calculated at the outset and stored, e.g. in a random access memory (RAM) for use throughout the calculations involved in the Viterbi algorithm.

Referring back to equation (1) it will be evident that there are $2^c$ pairs of calculations involved in making each transition along the trellis. Also, there will be $2^c$ new path metrics stored as the survivor paths after each trellis state calculation.

After completing each trellis transition there will be $2^c$ new survivor bits, one for each state. The survivor bits are normally stored in memory for each transition, usually until completion of the sequence.

The survivor bit store will therefore be $2^c$ bits wide and of length equal to the number of samples N.

The final stage of the Viterbi algorithm procedure is so-called "trace back". Trace back starts from the survivor bit which corresponds to the maximum final path metric. If the survivor bit is 'a' and the state number is b then the next state number in the trace back is $$a.2^{c-1} + b/2$$

This corresponds to shifting the current state one bit to the right, putting the survivor bit in the most significant bit position and discarding the least significant bit, which gives the maximum likelihood state at the previous stage in the trellis.

Thus, for example if the last state was 0110 (state number 6) and the survivor bit is 1, then the next state is 1011 (state number 11). If the survivor bit for state number 11 from the previous stage in the trellis was 0 then the next state will be 0101 (state number 5), and so on. Hence, it can be seen that a unique path representing the maximum likelihood bit sequence can be identified by the trace back. The maximum likelihood sequence are the bit values occurring at the trace back state positions in the survivor bit store, i.e. 10 ... in the above example.

To summarize, the Viterbi algorithm comprises three main stages.

1. Calculate branch metrics.
2. Calculate path metrics through the trellis for all observation samples.
3. Perform trace back to establish maximum likelihood sequence.

An architectural arrangement for implementing the Viterbi algorithm will now be described with reference to FIG. 2. In this embodiment the Viterbi processor (detector) is employed for equalisation of a signal received over a dispersive communication channel.

In accordance with the present invention the Viterbi detector comprises a common adder/accumulator 1 into which, by time multiplexing, values from various sources can be applied on inputs 2, 3 for implementing the various equations of the Viterbi algorithm.

Figure 3:
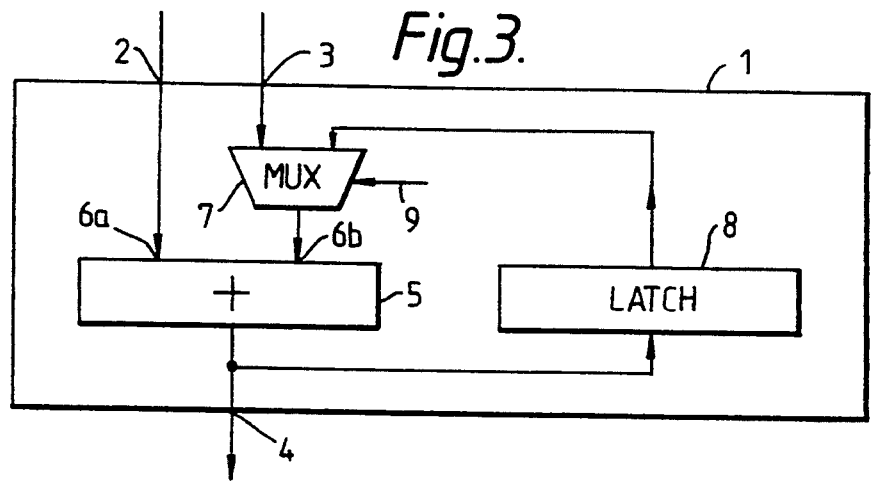
FIG. 3 is a block diagram showing the internal configuration of the add/accumulate block in FIG. 2.

The internal configuration of the adder/accumulator 1 is shown in more detail in FIG. 3. The external input 2 is coupled directly to the input 6a of an arithmetic adder 5 and external input 3 is coupled to the input 6b of the adder via a multiplexer 7. The output of the adder is coupled directly to the external output 4 of the adder/accumulator 1 and is also fed back to the input 6b of the adder 5 via a latch 8 and the multiplexer 7. A control signal applied to the multiplexer 7 on control line 9 determines which input to the multiplexer is fed forward to the adder. In practice, the input from latch 8 will normally take precedence over the external input 3 unless or until an initialization signal is applied on the control line in which case the adder/accumulator 1 is effectively reset.

To illustrate the operation of the adder/accumulator 1 consider the summation of four terms A+B+C+D. At the outset an initialization signal is applied to multiplexer 7 on control line 9. The values A and B are applied respectively on inputs 2 and 3. The value A is applied directly to adder 5. By virtue of the initialization signal on control line 9 the multiplexer applies value B at input 6b of the adder 5. Hence the adder 5 sums A and B and the result is held in latch 8. The initialization signal on control line 9 is now removed so that the output of latch 8 can now be applied to the input 6b of the adder 5. At the next stage of the operation value C is applied at external input 2 and hence to the adder 5. By virtue of a clock signal applied to the latch 8 the value A+B stored therein is applied (via multiplexer 7) to the input 6b of the adder 5 in synchronization with the input value C. Hence adder 5 calculates (A+B)+C and stores the result in the latch 8 in place of the previous value (A+B). The value D is then applied at input 2 and this value is combined with the value (A+B+C) from the latch via the multiplexer 7 in the same manner as before. Hence the total summation (A+B+C)+D is calculated by the adder 5 and the result is available at the output 4. At this stage, the signal on the multiplexer control line is returned to the initialization value whereby the input 3 is coupled to the adder instead of the latch output so that the adder/accumulator is ready to perform the next calculation. (Note that it is immaterial what value is stored in the latch from the previous calculation since this will in effect be overwritten after the first add operation of the current calculation).

It is noted here that the switching of the various inputs to the adder/accumulator 1 is achieved by a plurality of respective CMOS transmission gates 10 to 15 each of which has a respective control line (depicted in the Figure by an incoming arrow). The impedance of the gates 10 to 15 is high when they are turned off. The control signals to the gates are applied, for example under the control of a finite state machine so that the various arithmetic operations inherent in the Viterbi algorithm calculations are performed in the appropriate sequence. Finite state machines are themselves well known in the art and so no further details need be given here except to note that when the finite state machine is in each state, a counter sequences each of the calculations. The counter also ensures that the relevant memory locations are addressed at the appropriate time. When the counter reaches a predetermined value the state machine moves to the next state and clears the counter. The state sequencing and associated number of clock cycles is discussed in more detail below.

The Viterbi detector in FIG. 1 will now be described in relation to the three main stages of the Viterbi algorithm mentioned above.

1. Branch Metric Calculation

This section implements equation (3) above viz.

$$F(\sigma_n, \sigma_{n-1}) = s_0 \pm 2s_1 \pm 2s_2 \pm 2s_3 \pm 2s_4$$

when $F(\sigma_n, \sigma_{n-1})$ is the branch metric.

Figure 4:
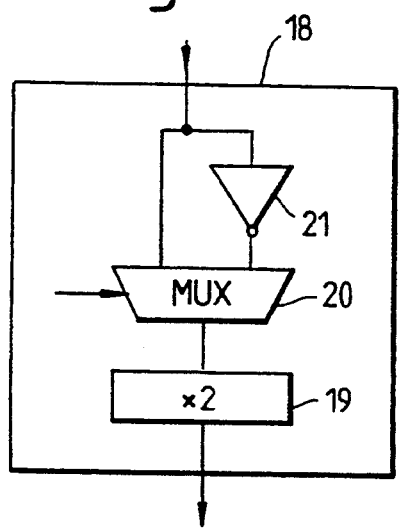
FIG. 4 is a block diagram showing the internal configuration of one of the blocks for performing multiplication by ±2 in FIG. 2.

The values $s_0, s_1 \ldots s_4$ are determined from estimates of the channel characteristics in known manner. The value $s_0$ is stored in a latch 16 (or other memory device) and the values $s_1$, to $s_4$ are stored in a random access memory (RAM) 17 labelled S RAM in FIG. 2. Addressing of S RAM 17 is effected under the control of the finite state machine counter. Latch 16 is coupled directly to the initialization input 3 of the adder/accumulator 1 via gate 13, and S RAM 17 is coupled to the input 2 through gate 10 via a multiplication stage 18 labelled S MULT in FIG. 2. S MULT 18 is shown in more detail in FIG. 4. The multiplication of the $s_1$ to $s_4$ values by two is effected simply by shifting the s value left by one position and adding a 0 at the least significant bit position. This is effected at stage 19. S MULT 18 also includes a multiplexer 20 under the control of a signal applied from the finite state machine to select the positive or negative value of $s_1 \ldots s_4$ depending on the particular calculation being performed.

It is noted here that two's complement arithmetic is used at this stage and throughout the present embodiment. As is very well known, two's complement is a method of forming the binary equivalent of a negative number. The (positive) number value is written in binary, each digit is then inverted (i.e. 0 becomes 1 and vice versa) and a 1 is added in the least significant position. Two's complement arithmetic enables a subtraction operation to be achieved by adding the two's complement of the number to be subtracted. Hence in the present embodiment two's complement arithmetic enables the adder 5 to be used for effecting all the branch metric calculations including those where terms have to be subtracted. To this end S MULT 18 includes an inverter 21 for inverting the s values. The additional binary 1 is simply added by the adder 5 as a "carry in" to the least significant bit.

If the add/accumulate circuit is initialized to as described here (i.e. $s_0$ is applied to the initialization input 3) then there are four distinct add/accumulate operations (and hence four clock cycles) needed to perform each branch metric calculation. Hence a 6-bit counter can be used to sequence the branch metric operation, the four most significant bits determine which of the sixteen metrics is being calculated and the two least significant bits sequence the four additions required for each metric.

It is noted, however, that in an alternative embodiment all of the s values including $s_0$ may be stored in S RAM 17 and applied to the input 2 of adder 5. In this case a standard initialization value of 0 may be applied on initialization input 3. In this case, however, there will be five distinct add/accumulate operations (and hence five clock cycles) needed to perform each branch metric calculation.

Figure 5:
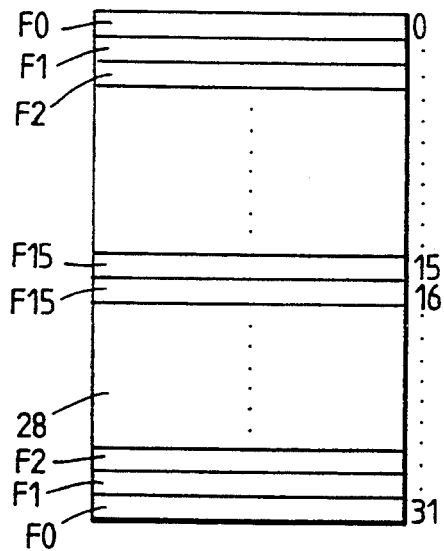
FIG. 5 is a diagram showing the memory locations of the branch metric store in FIG. 2.

In theory there are 32 branch metrics in the case of 16 state trellis as explained above, but only sixteen need to be calculated because in equation (2) the term $a_n^2$ is positive whether $a_n$ is $+1$ or $-1$. The full set of thirty-two branch metrics is therefore reflected about its mid point. The branch metrics calculated by the adder/accumulator 1 are stored in a RAM 23 labelled BRANCH METRIC STORE in FIG. 2. The structure of the BRANCH METRIC STORE 23 is shown in more detail in FIG. 5, with branch metric $F_0$ stored in locations 0 and 31, and the branch metric $F_1$, stored in locations 1 and 30 and so on, the branch metric $F_{15}$ being stored in locations 15 and 16. It will be evident to a person skilled in the art that due to the symmetrical distribution of branch metrics about the mid-point a RAM having only sixteen memory locations may be used instead to store the branch metrics with appropriate addressing i.e. with $F_0$ stored in location 0 only, $F_1$ stored in location 1, and so on. Addressing of the BRANCH METRIC STORE is determined by the finite state machine.

2. Path Metric Calculation

This section implements equations (1) above, viz $$J_n = 2.a_n obs + max\{J_{n-1} - F(\sigma_n, \sigma_{n-1})\}$$

where, as before, $a_n = \pm 1$, obs is the external observation of the received data for the current trellis transition, $J_{n-1}$ is the previous path metric, and $F(\sigma_n, \sigma_{n-1})$ is the branch metric.

Figure 2:
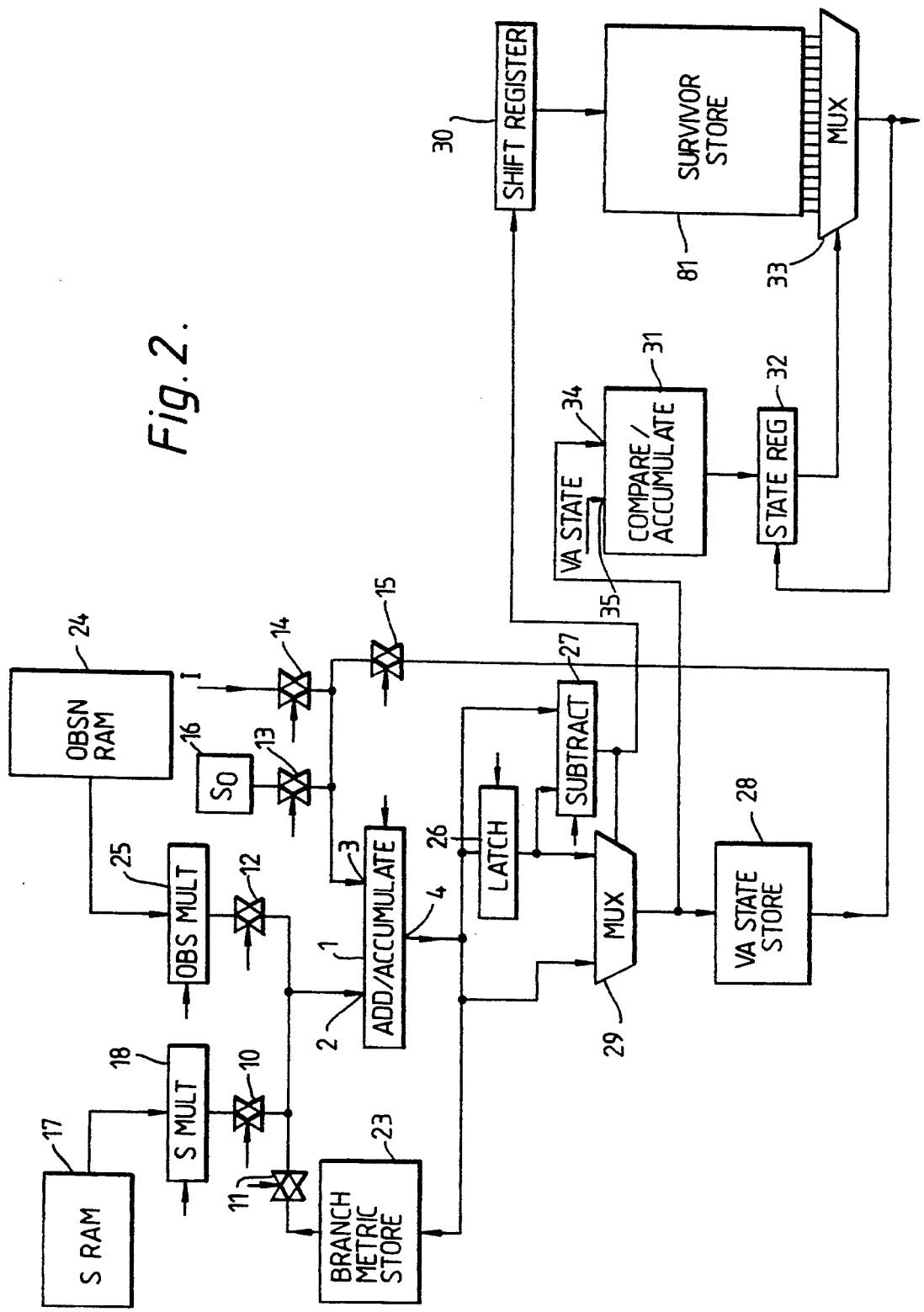
FIG. 2 is a schematic block diagram of a Viterbi processor in accordance with the present invention.

The observed values obs are stored in a RAM 24 labelled OBSN RAM in FIG. 2. Addressing of OBSN RAM 24 is effected under the control of the finite state machine. OBSN RAM 24 is coupled to the input 2 of the common adder/accumulator 1 through gate 12 via a multiplication stage 25 labelled OBS MULT in FIG. 2. The internal configuration of OBS MULT 25 is equivalent to S MULT 18 shown in FIG. 4. OBS MULT 25 thus effects the operation $\pm 2.obs$.

The BRANCH METRIC STORE 23 is also coupled to the input 2 of the adder/accumulator 1 but through a different gate 11.

The previous partial path metrics are stored in a RAM 28 labelled VA STATE STORE in FIG. 1. Sixteen partial path metrics are stored in the VA STATE STORE 28, one for each node of the trellis at the previous stage $n-1$, at locations representative of the state number. Hence the partial path metric for state 0 is stored at location 0, the partial path metric for state 1 at location 1 and so on. Addressing of the VA STATE STORE is effected under the control of the finite state machine.

VA STATE STORE 28 is coupled to the input 3 of the adder/accumulator 1 through gate 15. Thus, the adder/accumulate circuit is initialized to $J_{n-1}$. Hence, there are two add/accumulate operations (and hence two clock cycles) for each possible state transition involving respectively the terms $F(\sigma_n, \sigma_{n-1})$ and $2.a_n.obs$.

As explained in detail above there are two partial path metrics for each node of the trellis, associated respectively with a 1 or 0 survivor bit. For example, consider the partial path metrics for the state 0010. The partial path metric $J_n^0$ in respect of a 0 survivor bit is given by $$J_n^0(0010) = 2obs + J_{n-1}(0001) - F(0001 \rightarrow 0010)$$

and the partial path metric $J_n^1$ in respect of a 1 survivor bit is given by $$J_n^1(0010) = 2obs + J_{n-1}(1001) - F(1001 \rightarrow 0010)$$

The first partial path metric $J_n^0$ is calculated in the adder/accumulator 1 and the result stored in latch 26. Subsequently the second partial path metric $J_n^1$ is calculated in the same adder/accumulator 1. The two partial path metrics are compared by a subtractor 27 and the result of the subtraction operation controls a multiplexer 29 whereby the larger of the two partial path metrics is selected for input to the VA STATE STORE 28. Since it is only the sign of the subtraction operation that is required, i.e. to indicate which of the two partial path metrics is the larger, the subtractor may output a single bit. Specifically, a 1 output may indicate that the larger partial path metric is that corresponding to a 1 survivor bit ($J_n^1$) whereas a 0 output would indicate that the larger partial path metric is that corresponding to a 0 survivor bit ($J_n^0$), It will be noted that in this case the output of subtractor 27 directly constitutes the survivor bit and will be used in this capacity as discussed further below. The larger partial path metric is written into the VA STATE STORE 28 at the appropriate location overwriting the previous partial path metric already written at that location, using a cyclic addressing pattern e.g. as proposed in the paper entitled "In-place Updating in Viterbi Decoders" by M Biver, H Kaeslin and C Tommansini published in IEEE Journal of Solid Stage Circuits Volume 24, No. 4, August 1989, pages 1158–60.

An alternative implementation of the VA STATE STORE 28 may involve a ping-pong arrangement of two RAMs, one of which is written with $J_n$ values, the other being the source of $J_{n-1}$ values. When a full trellis transition has been completed at stage n, the function of the two RAMs is interchanged for the trellis calculations at stage $n+1$ so that the existing $J_n$ values become the new $J_{n-1}$ values and a new set of $J_n$ values is calculated and stored in the RAM previously containing the $J_{n-1}$ values.

In summary, therefore, it will be seen that two adder/accumulator operations (two clock cycles) are needed to calculate each partial path metric, hence four operations (clock cycles) for each state. Sixty four cycles are therefore required to calculate all sixteen partial path metrics.

Control of the partial path calculations is achieved using the finite stage machine counter. The two least significant bits sequence the four additions required for the calculation of each new partial path metric. The next four bits determine which of the sixteen path metrics is being calculated. The remaining (most significant) bits determine which trellis transition is being calculated, and hence which observation value to use. The number of bits in this counter will therefore depend on the number of observations.

For the very first trellis transition, instead of a true previous partial path metric, a trellis initialization signal I is driven onto the input 3 of adder/accumulator 1. This value may be forced to zero for all metric calculations. Alternatively, if the preceding bit sequence is known, I can be initialized to some arbitrary positive value for the known state.

As each partial path metric is calculated a corresponding survivor bit has to be stored for use during the subsequent trace back phase. As explained above in the theory of the Viterbi algorithm, the survivor bit is the most significant bit of the state at stage n (and represents the transition bit four transitions earlier, i.e. at stage n−4). As has been explained above the output of the subtractor 7 constitutes the survivor bit. Thus, as each of the partial path metrics is calculated in turn, the survivor bit output from subtractor 27 is input into a 16 bit shift register 30, i.e. one survivor bit for each state. Thus when the first partial path metric is calculated for the state 0 the first survivor bit is fed into the most significant bit position in the shift register 30. When the second partial path metric is calculated for state 1 the first survivor bit is shifted to the right and the second survivor bit is input into the most significant bit position, and so on. When the sixteenth partial path metric is calculated the sixteenth survivor bit is input into the most significant bit position at which point the first survivor bit is shifted into the least significant bit position. Hence the position of the survivor bit corresponds directly to the state number. After all sixteen survivor inputs have been input to the shift register 30 the data is transferred as a 16-bit word into a random access memory 81 designated as SURVIVOR STORE in FIG. 1. This process is repeated at each of the N stages of the trellis (where N is the number of external observations of the received data signal) so that at the end of the trellis calculations there will be N 16-bit words stored in the SURVIVOR STORE 81 their respective locations corresponding to the chronological occurrence in the sampling sequence.

3. Trace Back

Figure 6:
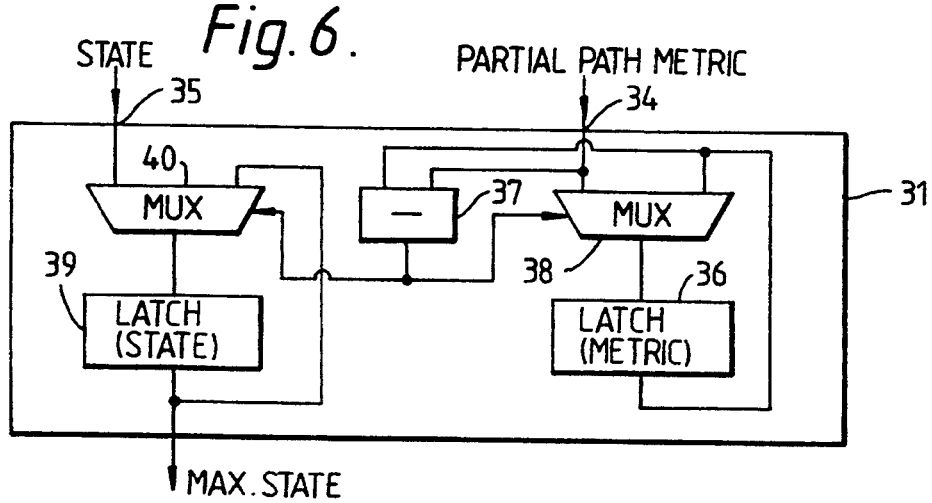
FIG. 6 is a block diagram showing the internal configuration of the comparator/accumulator block in FIG. 2.

The theory of the trace back operation has already been described above. In the present embodiment a comparator/accumulator 31 is included to select the largest partial path metric at the final stage of the trellis. The internal arrangement of the comparator/accumulator 31 is shown in FIG. 6. The comparator/accumulator 31 thus compares each of the sixteen partial path metrics on input 34 and stores the metric in latch 36 only if it is larger than the previously held value. The comparison is performed by a subtractor 37 the output of which controls a multiplexer 38. This circuit also stores in latch 39 the actual state corresponding to the currently stored partial path metric. The state values are applied on input 35 of a multiplexer 40 which, also under the control of the output signal from subtractor 37 selects whether to retain the current state stored in the latch or to update it with the new state depending respectively on whether the new partial path metric is smaller than or exceeds the current value in latch 36. At the end of all the partial path metric comparisons the comparator/accumulator 31 has stored in latch 36 the maximum partial path metric and in latch 39 the associated state. The maximum state (comprising four bits) is then transferred from latch 39 into a shift register 32 labelled as STATE REG in FIG. 2. The state thus stored in STATE REG 32 is the initial state for the trace back. STATE REG 32 controls the operation of multiplexer 33 coupled to the output of SURVIVOR STORE 81, and determines the location of the initial survivor bit which is output from the multiplexer 33. The survivor bit is also fed back to the most significant bit position of STATE REG 32 and shifted one position to the right each time a new survivor bit is added, the bit in the least significant position being discarded each time. Thus the new value in STATE REG 32 indicates the location (=state number) of the survivor bit to be recovered from the next 16-bit word stored in the SURVIVOR STORE 81. Again this survivor bit is output from multiplexer 33 and also fed back to the most significant bit position in STATE REG 32 to determine the position of the survivor bit to be recovered from the next 16-bit word in the SURVIVOR STORE 81.

The process is repeated until the survivor bits have been recovered from all N 16-bit words stored in SURVIVOR STORE 81. The resulting bit stream output from the SURVIVOR STORE 81 is the maximum likelihood sequence of transmitted bits (in reverse order).

The operation of the trace back stage will be more clearly understood in the light of an example. Assume therefore that at the final transition, i.e. stage N, the comparator/accumulator 31 calculates that state number 4 (0100) has the maximum partial path metric. The state 0100 will be stored in STATE REG 32. This will cause the fourth bit (from the least significant bit position) of the last word in the SURVIVOR STORE 81 to be output from the multiplexer 33 as the first survivor bit. Assume this bit is a 1. This survivor bit is also fed back to the most significant bit of the STATE REG 32. Hence the new state stored in the STATE REG will become 1010 (i.e. state number 10). This will cause the tenth bit (from the least significant bit position) of the penultimate word in the STATE STORE 81 to be output from the multiplexer 33. Assume this bit is a 0. The new STATE REG value will become 0101 (state number 5) causing the fifth bit of the third from last word to be output from the multiplexer 33 and so on. Hence the resulting bitstream (the maximum likelihood bit sequence) in this case will be 10 . . .

To conclude this description of a first embodiment of the invention, it is useful to recap on the state sequence of the finite state machine, and to consider the timing aspect. When the finite state machine is in each state a counter sequences the calculations. When the counter reaches a predetermined value the state machine moves to the next state and clears the counter. The following table shows the various states and the associated clock cycles.

| FSM STATE | Counter | Explanation |
| --- | --- | --- |
| 1. Reset | 0 | |
| 2. Branch Metric Calculation | 0→63 | (16 branch metrics; each take 4 cycles to compute). |
| 3. Path Metric Calculation | 0→(64 × N) | (Number of observations × 64 cycles per observation). |
| 4. Trace Back | 0→N | (Trace back through N trellis transitions). |

It can be seen, therefore, that the total number of clock cycles for a complete Viterbi algorithm calculation is $$64 + (N \times 64) + N$$

for example if there are 116 observations, the total number of clock cycles will be 7604. Thus, at 10MHz the present detector would be able to complete all the computations involved in 0.76 ms.

As presented thus far the partial path metrics will grow without bound as transitions proceed across the trellis. This arrangement will be adequate if sufficient precision exists. However, if the metrics become too large a nomalization circuit may readily be included. The comparator/accumulator 31 may be adapted to determine the maximum of the sixteen partial path metrics at each stage of the trellis. This value may be subtracted as a constant offset from the values emerging from the VA STATE STORE 28 during the next time increment along the trellis. The additional hardware (not shown) would comprise a latch to hold the offset value and an adder to add the offset (using two's complement arithmetic).

Figure 7:
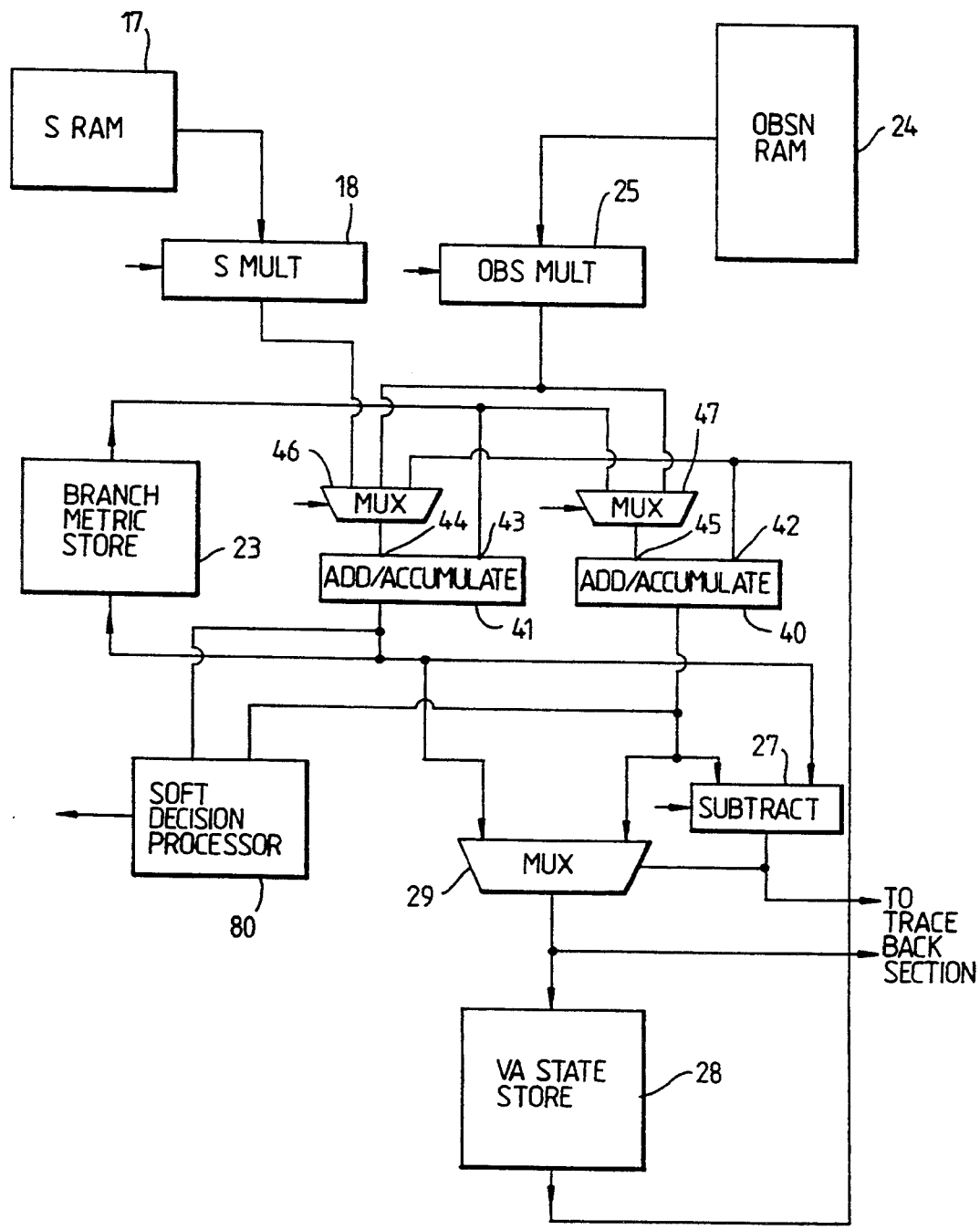
FIG. 7 is a schematic block diagram of a further embodiment of a Viterbi processor in accordance with the invention.

FIG. 7 shows a modified version of the Viterbi detector described with reference to FIG. 2. It is noted however that for the sake of clarity the trace back portion of the detector (which may be identical to that shown in FIG. 2) has been omitted from FIG. 7.

In this embodiment the single adder/accumulator of the previous embodiment is replaced by a pair of parallel-arranged adder/accumulators 40, 41. One of the adder/accumulators 41 has one of its inputs 44 coupled to the S RAM 17 for calculation of the branch metrics exactly in the manner as already described. In this case the term $s_0$ is also stored together with the terms $s_1$ to $s_4$ in the S RAM 17.

The input 44 of adder/accumulator 41 is coupled via a multiplexer 46 to the VA STATE STORE 28, to the OBSN RAM 24, and to the S RAM 17. Note that in this embodiment the multiplexer 46 has three inputs. The input 43 of adder/accumulator 41 is coupled to the BRANCH METRIC STORE 23. On the other hand, the input 45 of adder/accumulator 40 is coupled via a multiplexer 47 to the BRANCH METRIC STORE and to the OBSN RAM 24. The input 42 of adder/accumulator 40 is coupled to the VA STATE STORE 28.

This arrangement enables each pair of partial path metrics $J_n^0$, $J_n^1$ for a particular state to be calculated simultaneously, thus halving the number of clock cycles required for this section of the Viterbi algorithm calculation. The reason for the different order of interconnects to the adder/accumulators 40, 41 via the multiplexers 47, 46 is that the values of the partial path metric $J_{n-1}$ and the branch metric $F(\sigma_n, \sigma_{n-1})$ are different for each of $J_n^0$ and $J_n^1$ as has been explained previously. Hence during the calculation of $J_n^0$ the appropriate branch metric value is applied to adder/accumulator 41 on input 43, whereas the appropriate partial path metric is applied to the adder/accumulator 40 on input 42. At the next clock cycle the situation is reversed in that the appropriate branch metric is applied to adder/accumulator 40 via multiplexer 47 and the partial path metric is applied to the adder/accumulator 41 via multiplexer 46. The observation value is the same for both adder/accumulators. Hence only two clock cycles are needed to calculate both partial path metrics $J_n^0$ and $J_n^1$. The outputs of the adder/accumulators 40 and 41 are applied directly to the subtractor 27 for comparison purposes to determine the larger of the two values which is then stored in the VA STATE STORE 28 in exactly the same manner as in the previous embodiment. It is noted, however, that the parallel $J_n$ processing employed here means that the intermediate latch 26 (necessary in the previous serial-processing embodiment for the $J_n$ compare stage) can be dispensed with altogether.

The decisions made by the Viterbi detector discussed thus far are 'hard' decisions in the sense that the estimated data symbols correspond exactly to the data symbols of the particular alphabet used. Hence, in the present case of a 2-symbol alphabet the data symbols would be in strict binary digitised form, i.e. expressed in terms of only two levels, e.g. 0 and 1.

However, the present embodiment includes a soft decision processor 80 coupled to the respective outputs of the add/accumulate stages 40 and 41. The soft decision processor outputs soft decisions, that is to say the estimated data symbols may be quantized at more levels than there are symbols in the alphabet being used (for example at eight levels in the case of a 2 symbol alphabet) and so convey certainty information as regards the correctness (or 'confidence level') of the decision made.

In the case of convolutional channel code introduced for the purpose of error correction, the full sequence of estimated data symbols output by the equaliser would be further processed by a decoder. In accordance with the present invention the equaliser hardware already described may be re-used to perform the decoding operation by using time multiplexing, as discussed in more detail below. The availability of soft decisions at the decoder input enables the overall bit error performance to be improved compared with hard decisions, since the decoder is able to utilize the certainty information in arriving at a final more accurate decision.

Figure 8:
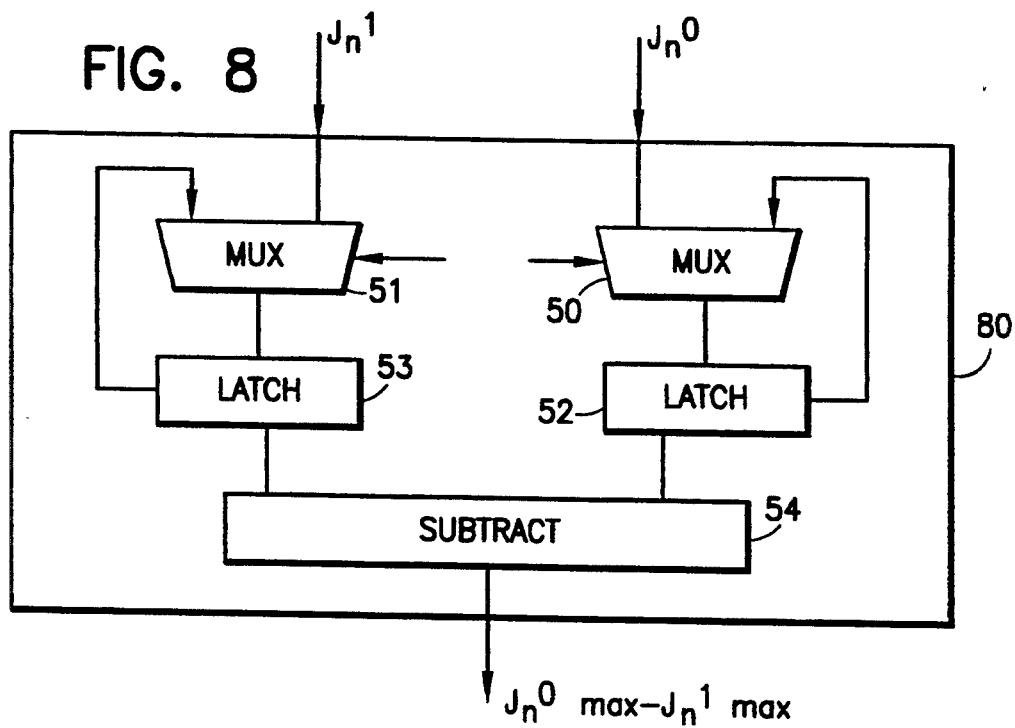
FIG. 8 is a block diagram showing in more detail the soft decision processor in FIG. 7.

The internal configuration of the soft decision processor 80 is shown in more detail in FIG. 8.

Figure 9:
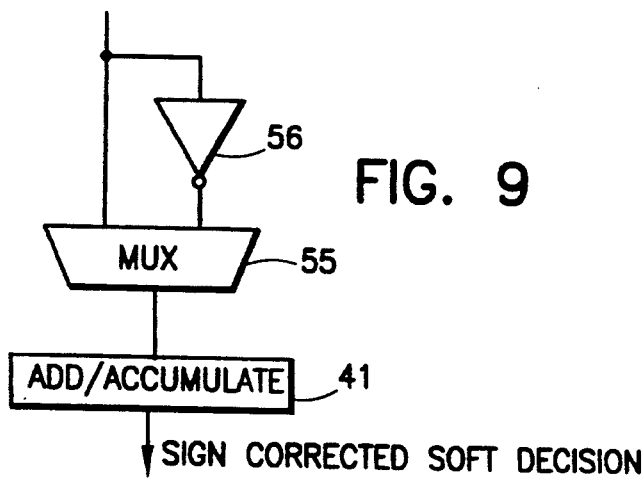
FIG. 9 is a block diagram showing the processing of soft and hard decisions.

The outputs ($J_n^0$, $J_n^1$) of the adder/accumulator stages 40, 41 are input to a respective multiplexer 50, 51 which in turn are coupled respectively to a latch 52, 53. When a new $J_n^0$, $J_n^1$ value is input to the multiplexer the latch is updated with the value output by the multiplexer. Only if the new value exceeds the existing value does the multiplexer output the new value. Otherwise the multiplexer outputs the existing value already held in the latch. Hence the latches 52, 53 store the maximum values of $J_n^0$ (i.e. $J_n^0$max) and $J_n^1$ (i.e. $J_n^1$max) are input to a subtractor 54 which calculates the difference $J_n^0$max$-J_n^1$max and this value is output from the soft decision processor 80 to form the soft decision. This method of soft decision generation is the subject of our co-pending UK patent application No. 8927005.2 (our reference PAT 89014) to which reference is invited for further information. The soft decision may be stored in RAM for use at the trace back stage when the soft decision information is combined with the hard decision information to indicate the confidence level of each of the estimated data symbols. FIG. 9 shows an arrangement for combining the soft and hard decisions re-using one of the adder/accumulator stages 41. Each soft decision is input directly to a multiplexer 55 and also via an inverter 56. The output of the multiplexer 55 is controlled by the hard decisions. In the present embodiment where the bits 1 and 0 are mapped to $+1$ and $-1$ respectively the hard decision determines the sign of the multiplexer output. When the output has to be negated (because the hard decision is of opposite sign to the calculated soft decision, i.e. the trace back is reversing the decision made as the trellis was calculated the inverted soft decision is output by multiplexer 55 and the adder/accumulator 51 adds a 1 at the least significant bit position (i.e. two's complement version of the negative number). In the case where the multiplexer output has to be positive (because the hard decision matches the sign of the soft decision) the non-inverted soft decision is output by the multiplexer 55 and in this case the adder/accumulator has no effect. Thus the hard decision represents the sign of the decision estimated bit and the soft decision indicates the confidence level of this decision. The output of the adder/accumulator 41 is thus a sign corrected soft decision which can be used directly at the decoding stage, as discussed below.

The Viterbi algorithm can similarly be used at the decoding stage for recovering the original data from data which has been convolutionally encoded before transmission. In this case the partial path metrics $J_n$ are given by the equation $$J_n = J_{n-1} + \sum_{i=1}^{R} \pm \text{(soft decision)}_i \qquad (4)$$

where $J_{n-1}$ is the previous partial path metric as before) and R is the inverse of the code rate (i.e. $R=2$ for half rate code, $R=3$ for third rate code and so on, where the code rate indicates the redundancy level of the transmitted data, i.e. in half rate code two bits are used to encode a single bit (50% redundancy), and in third rate code three bits are used to encode a single bit (66% redundancy), etc).

Hence it can be seen that the number of terms in the calculation of each partial path metric $J_n$ is $R+1$. In other words each partial path metric calculation involves R arithmetic operations, i.e. R clock cycles. Therefore, half rate codes require two clock cycles to compute each partial path metric, third rate codes require three cycles; sixth rate codes require six cycles. The plus or minus sign between terms is determined by the particular mapping scheme used. In this example a 1 maps to a plus sign (+) and a 0 maps to a minus sign (−).

Figure 10:
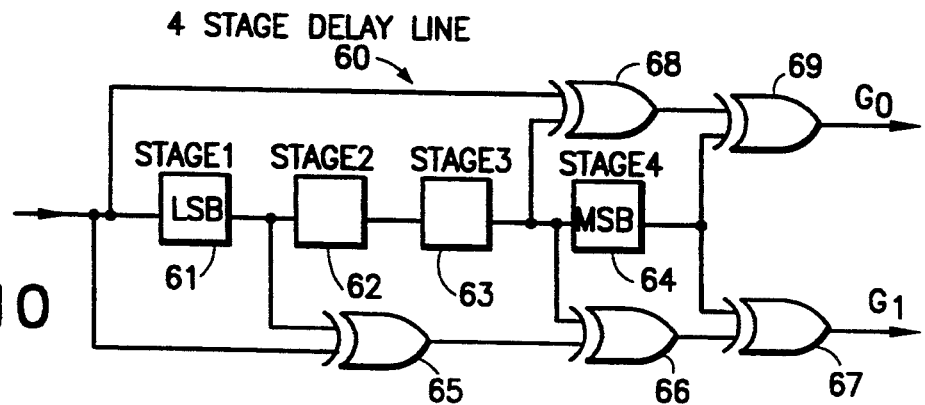
FIG. 10 is a block diagram of an encoder for generating convolutionally encoded data.

The encoding scheme used may be exactly analogous to the effect of transmitting data on a dispersive channel. That is to say the encoder may in essence locally recreate the circumstances of a dispersive channel, i.e. even before the data is transmitted. For example, FIG. 10 shows a convolution encoder which implements the polynomials:

$$G_0 = 1 + D^3 + D^4$$

$$G_1 = 1 + D + D^3 + D^4$$

This is the encoding scheme proposed for the speech channel in the Pan-European Digital Mobile Communication system (GSM).

This encoder in FIG. 10 comprises a delay line comprising a four stage shift register 60. The four stages are designated 61-64 respectively from the least significant bit position to the most significant bit position. The input to the delay line and the output of the first stage 61 (i.e. the least significant bit position) form the respective inputs to an XOR gate 65. The output of XOR gate 65 and the output of the third stage 63 of the delay line form the inputs of XOR gate 66. The output of XOR gate 66 and the output of the fourth stage 64 of the delay line form the inputs of XOR gate 67. The output of XOR gate 67 is the value $G_1$.

Similarly, the input to the delay line and the output of the third stage 63 of the delay line form the inputs of XOR Gate 68. The output of XOR gate 68 and the output of the fourth stage 64 of the delay line form the inputs to XOR gate 69. The output of XOR gate 69 is the value $G_0$.

The four stages 61-64 of the delay line represent the current state. When a new bit is input into the least significant bit position at stage 61 the bits in the shift register move along one position and the bit in the most significant bit (stage 64) is discarded. Hence the state transition scheme is exactly analogous to that already described for the equaliser, in which the constraint length is also 4.

Figure 11:
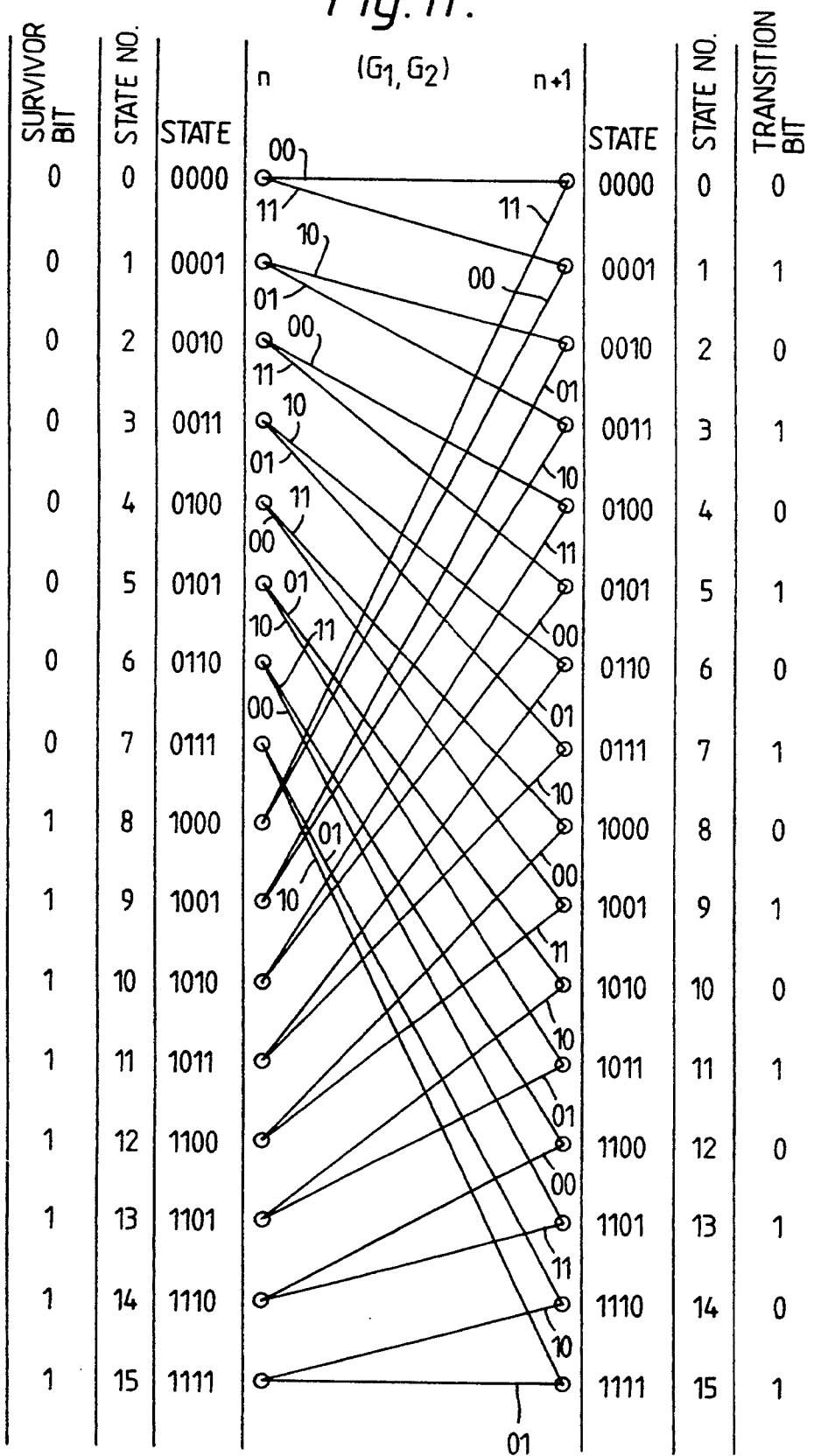
FIG. 11 is part of a 16-state trellis diagram for use at the decoder stage.

FIG. 11 shows part of the trellis diagram for the decoder. Since the constraint length is four, there are once again sixteen states, each having two path metrics associated therewith. In the figure the bit pair indicated adjacent each transition are the values of $G_1$ and $G_0$ resulting from the transition in question. For example, referring back to FIG. 10, assume the current state is 0000. By definition the previous state must have been either 0000 or 1000. In the former case $G_1=0$ and $G_0=0$ and in the latter case $G_1=1$ and $G_0=1$. These bit pairs are shown on the respective transitions in FIG. 11. Taking another example, if the current state is 1001 (state number 9) the previous state must have been either 0100 (state number 12) or 1100 (state number 4). In the former case $G_1=0$ and $G_0=0$, and in the latter case $G_1=1$ and $G_0=1$. The values of $G_0$ and $G_1$ are shown in FIG. 11 for all state transitions.

Returning to equation (4) above, for a half rate code $$J_n = J_{n-1} \pm \text{(soft decision)}_1 \pm \text{(soft decision)}_2$$

where (soft decision)$_1$ and (soft decision)$_2$ are the observed values of $G_1$ and $G_0$ respectively.

Figure 12:
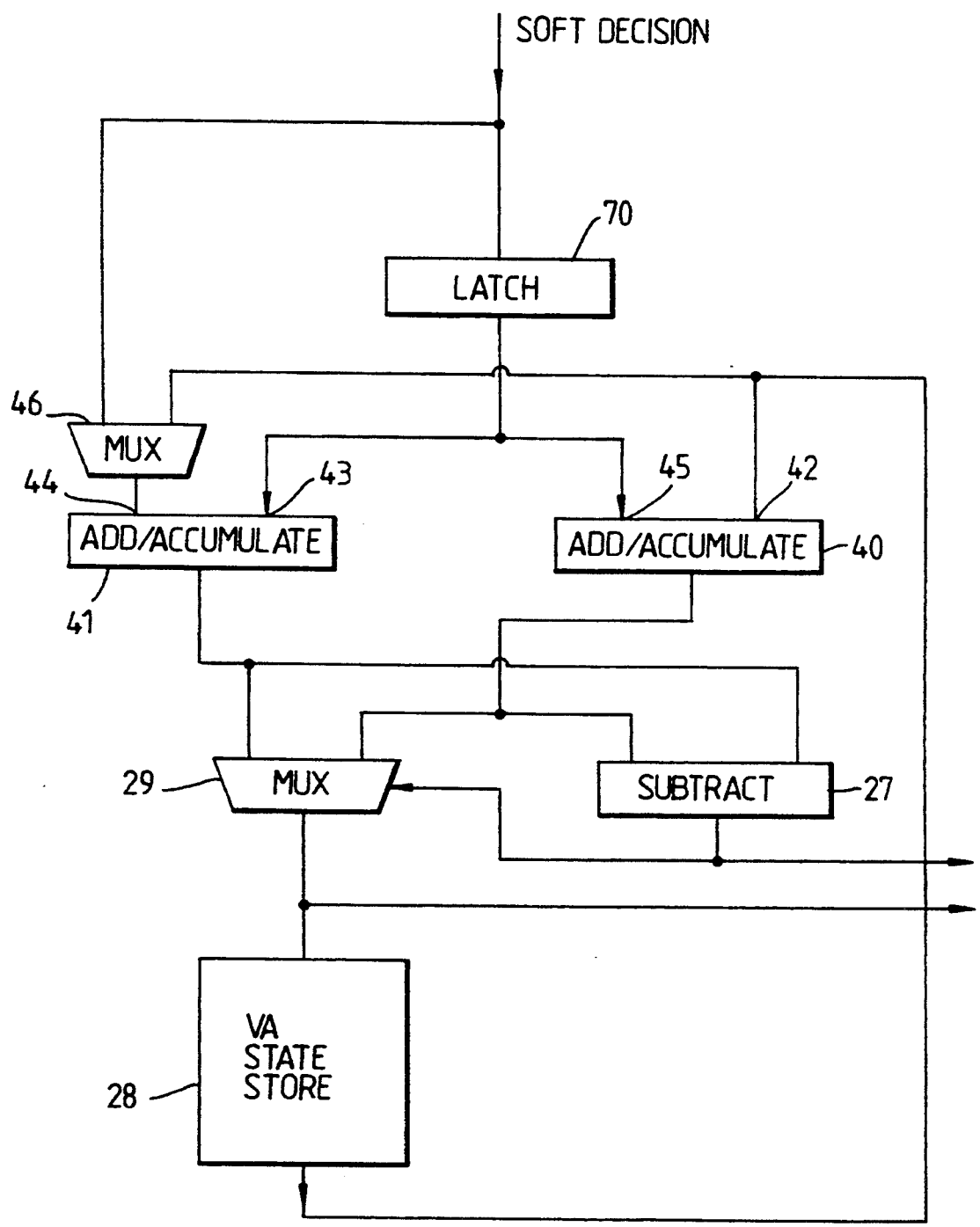
FIG. 12 is a schematic block diagram of the Viterbi processor in FIG. 7 modified for operation as a decoder.

For a constraint length of 4, as considered here, there are sixteen states and, therefore thirty two path metrics to be calculated. Each path metric requires two add-/subtract operations, hence two clock cycles to calculate. The Viterbi detector described above with reference to FIG. 7 can be re-used, again using time multiplexing, to calculate the $J_n$ values at the decoding stage, the adder/accumulator 41 calculating the $J_n^1$ values and the adder/accumulator 40 calculating the $J_n^0$ values, as before. Since the $J_n^0$ and $J_n^1$ values are calculated in parallel only two clock cycles are required to calculate each metric pair. Hence thirty-two clock cycles are required to calculate the full set of partial path metrics. The method of calculation and of trace back is exactly the same as has already been described for the equaliser and therefore no further details of the calculation operations need be given. However, FIG. 12 is a modified version of FIG. 7 showing only the common hardware and the additional elements required in the decode stage. The same reference numerals are therefore used to designate the same features. The only additional element is latch 70. The reason why latch 70 is needed will become evident from the following explanation.

The data source for the decoder is the sign corrected soft decision from the equaliser stage which suitably has been stored in RAM.

The multiplexer 46 is required because calculation of the two metrics $J_n^0$ and $J_n^1$ involve a different previous partial path metric as explained previously. However the multiplexer 47 is not needed at this stage. Instead the additional latch 70 is required. The soft decision data is coupled to input 44 of the adder/accumulator 41 via multiplexer 46 and to the input 45 of adder/accumulator 40 via the latch 70. The latched soft decision data is also coupled to input 43 of adder/accumulator 41. The VA STATE STORE 28 (providing the partial path metric values $J_{n-1}$) is coupled to the input 44 of adder/accumulator 41 via multiplexer 46 and to the input 42 of adder/accumulator 40.

At the first clock cycle the first soft decision $(SD)_1$ stored in latch 70 is applied to input 45 of adder/accumulator 40 and to input 43 of adder/accumulator 41. At the same time the relevant partial path metric $J_{n-1}^0$ from VA STATE STORE 28 is applied to input 42 of adder/accumulator 40 and the second soft decision $(SD)_2$ is applied to input 44 of adder/accumulator 41.

Hence at the first clock cycle adder/accumulator 41 performs the partial calculation $[\pm(SD)_1 \pm(SD)_2]$ while the adder/accumulator 40 performs the partial calculation $[J_{n-1}^0 \pm(SD)_1]$.

At the next clock cycle the second soft decision $(SD)_2$ replaces $(SD)_1$ in latch 70 and is therefore applied to input 45 of adder/accumulator 40; and the relevant partial path metric $J_{n-1}^1$ from VA STATE STORE 28 is applied to input 44 of adder/accumulator 41 via multiplexer 46. Hence at this second clock cycle the adder/accumulator 41 completes the calculation for the partial path metric in respect of 1 survivor bit, i.e.

$$J_n^1 = J_{n-1}^1 \pm [\pm(SD_1) \pm (SD)_2];$$

and the adder/accumulator 40 completes the calculation for the partial path metric in respect of a 0 survivor bit, i.e.

$$J_n^0 = [J_{n-1}^0 \pm (SD_1)] \pm (SD_2).$$

The sign of the calculation is determined by the bit pair $(G_1, G_0)$ associated with a particular transition, see FIG. 11, with 0 mapping to a minus sign and 1 mapping to a plus sign. For example a transition to state number 5 (0101) will involve adding $(SD)_1$ and $(SD)_2$ if the previous state $J_{n-1}$ was 0010 (state number 2) since the bit pair in this case is 11; and subtracting $(SD)_1$ and $(SD)_2$ if the previous state was 1010 (state number 10) since the bit pair in this case in 00.

If the sign of the calculation aligns with (matches) the sign of the observed soft decision and the confidence level is high, the resulting partial path metric will be large. If the signs align but the confidence level is low the resulting partial path metric will be lower. If the signs do not align (i.e. the soft decision is negative, but the 'expected' sign from the trellis diagram is positive, or vice versa) then the resulting partial path metric will be lower still.

The comparison of partial path metric pairs and the retention in the VA STATE STORE 28 of the maximum value for each state proceeds in exactly the same manner as for the equaliser. The trace back stage also proceeds in exactly the same manner, the final output from the decoder representing the maximum likelihood sequence of bits at the transmitter before the encoding operation.

Since the equalisation and decoding operations can be performed largely by the same hardware as described above, both functions i.e. the equaliser and decoder can be implemented on a single integrated circuit (i.e. on one 'chip') using conventional VLSI techniques well known to those skilled in the semiconductor fabrication art.

Furthermore, it is noted here that the common adder/accumulator stage(s) may also be reused for summing operations other than those involved in decoding and equalising, again using time multiplexing. For example, the channel estimation stage mentioned above involves correlating a training sequence, which suitably is stored in ROM at the receiver, with the centre portion of the incoming data burst. Processing of the resulting data involves a plurality of add and accumulate operations which can be performed by the common adder/accumulator before being used to calculate the various metrics for the Viterbi algorithm in the equaliser and decoder as described herein.

In view of the foregoing description it will be evident to a person skilled in the art that various modifications may be made within the scope of the invention. For example, the multiplexing means which enable the reuse of the common adder/accumulator may employ switching means other than CMOS transmission gates. Also, instead of a dedicated finite state machine other control means may be employed for controlling the multiplexing operations, for example a microcontroller specifically programmed for this purpose or other software control. Of course a detector in accordance with the invention is also suitable for estimating a maximum likelihood sequence of bits where the constraint length differs from four, i.e. the number of states in the trellis diagram may be more or less than sixteen. Furthermore, variants of the specific architectures disclosed herein may be utilized for implementing a maximum likelihood detector in accordance with the invention and indeed additional hardware may be incorporated for performing other operations associated with a data receiver.

I claim:

1. A maximum likelihood (ML) detector for estimating a data symbol in a sequence of transmitted data symbols received over a communication channel, wherein a plurality of different states is associated with the transmission of said data symbols, the ML detector comprising:

a plurality of data sources relating respectively to state transition probabilities and observed values of received data symbols, and means for calculating partial path metrics for each state using values from said data sources for enabling an estimation of a received data symbol to be accomplished; wherein the calculating means comprise common add/accumulate means having respective inputs from each of said plurality of data sources for performing repeated additive arithmetic operations and for storing a cumulative result thereof, and multiplexing means are provided for selectively coupling said data sources in a predetermined order to said common add/accumulative means to implement a partial path metric calculation.

2. A ML detector as claimed in claim 1, wherein the data sources relating to state transition probabilities include data sources relating respectively to previous partial path metrics and to branch metrics.

3. A ML detector as claimed in claim 2, including a further data source for outputting terms that represent a characteristic of the communication channel, and means for calculating the branch metrics using values from said further data source and from the data source relating to the observed values of the received data symbols, wherein the branch metric calculating means comprise said common add/accumulate means, the multiplexing means being adapted for selectively coupling said data sources in a predetermined order to said common add- /accumulate means to implement the branch metric calculations.

4. A ML detector as claimed in claim 1, wherein the data sources comprise memory means for storing the state transition probabilities.

5. A ML detector as claimed in claim 1, wherein the data sources include memory means for storing observed values of the received data symbols.

6. A ML detector as claimed in claim 1, wherein the predetermined order in which the multiplexing means couples the data sources to the add/accumulate means is such that for each state at a given time a first partial path metric is calculated in respect of a state transition corresponding to the transmission of a first symbol type, and subsequently a second partial path metric is calculated in respect of a state transition corresponding to the transmission of a second symbol type, means being provided for storing said first partial path metric, the detector further including means for comparing the first partial path metric in the storage means and the second partial path metric in the add/accumulate means and for selecting the larger of said first and second partial path metrics for each state in turn.

7. A ML detector as claimed in claim 6, including memory means for storing the larger of the first and second partial path metrics for each state.

8. A ML detector as claimed in claim 7, including data symbol storage means for storing for each state either a first or a second symbol depending on which of the first and second partial path metric is the larger.

9. A ML detector as claimed in claim 8, including means for reading from the data symbol storage means an estimate of the most likely sequence of transmitted data symbols.

10. A ML detector as claimed in claim 1, wherein the calculating means comprises a first add/accumulate means for calculating for each state in turn a first partial path metric in respect of a state transition corresponding to the transmission of a first symbol type, and a second add/accumulate means for calculating for each state in turn a second partial path metric in respect of a state transition corresponding to the transmission of a second symbol type.

11. A ML detector as claimed in claim 10, wherein said first and second add/accumulate means are arranged to operate in parallel.

12. A ML detector as claimed in claim 10, including means for comparing the first and second partial path metrics in said first and second add/accumulate means respectively and for selecting the larger of said first and second partial path metrics for each state.

13. A ML detector as claimed in claim 12, including memory means for storing the larger of the first and second partial path metrics for each state.

14. A ML detector as claimed in claim 13, including data symbol storage means for storing for each state either a first or a second symbol depending on which of the first and second partial path metric is the larger.

15. A ML detector as claimed in claim 14, including means for reading from the data symbol storage means an estimate of the most likely sequence of transmitted data symbols.

16. A ML detector as claimed in claim 1, including means for generating information indicative of the relative confidence level of each estimated data symbol.

17. An equalizer for equalising a signal which has become distorted by transmission through a dispersive communications channel, comprising: a maximum likelihood (ML) detector for estimating a data symbol in a sequence of transmitted data symbols received over a communication channel, wherein a plurality of different states is associated with the transmission of said data symbols, the ML detector comprising:
  a plurality of data sources relating respectively to state transition probabilities and observed values of received data symbols, and
  means for calculating partial path metrics for each state using values from said data sources, wherein the calculating means comprise common add/accumulate means having respective inputs from each of said plurality of data sources for performing repeated additive arithmetic operations and for storing a cumulative result thereof, and
  multiplexing means are provided for selectively coupling said data sources in a predetermined order to said common add/accumulate means to implement a partial path metric calculation.

18. An equaliser as claimed in claim 17, wherein the data sources relating to state transition probabilities include data sources relating respectively to previous partial path metrics and to branch metrics.

19. An equaliser as claimed in claim 18, including a further data source for outputting terms that represent a characteristic of the communication channel, and means for calculating the branch metrics using values from said further data source and from the data source relating to the observed values of the received data symbols, wherein the branch metric calculating means comprise said common add/accumulate means, the multiplexing means being adapted for selectively coupling said data sources in a predetermined order to said common add/accumulate means to implement the branch metric calculations.

20. An equaliser as claimed in claim 17, wherein the data sources comprise memory means for storing the state transition probabilities.

21. An equaliser as claimed in claim 17, wherein the data sources include memory means for storing observed values of the received data symbols.

22. An equaliser as claimed in claim 17, wherein the predetermined order in which the multiplexing means couples the data sources to the add/accumulate means is such that for each state at a given time a first partial path metric is calculated in respect of a state transition corresponding to the transmission of a first symbol type, and subsequently a second partial path metric is calculated in respect of a state transition corresponding to the transmission of a second symbol type, means being provided for storing said first partial path metric, the detector further including means for comparing the first partial path metric in the storage means and the second partial path metric in the add/accumulate means and for selecting the larger of said first and second partial path metrics for each state in turn.

23. An equaliser as claimed in claim 22, including memory means for storing the larger of the first and second partial path metrics for each state.

24. An equaliser as claimed in claim 23, including data symbol storage means for storing for each state either a first or a second symbol depending on which of the first and second partial path metric is the larger.

25. An equaliser as claimed in claim 24, including means for reading from the data symbol storage means an estimate of the most likely sequence of transmitted data symbols.

26. An equaliser as claimed in claim 17, wherein the calculating means comprises a first add/accumulate means for calculating for each state in turn a first partial path metric in respect of a state transition corresponding to the transmission of a first symbol type, and a second add/accumulate means for calculating for each state in turn a second partial path metric in respect of a state transition corresponding to the transmission of a second symbol type.

27. An equaliser as claimed in claim 26, wherein said first and second add/accumulate means are arranged to operate in parallel.

28. An equaliser as claimed in claim 26, including means for comparing the first and second partial path metrics in said first and second add/accumulate means respectively and for selecting the larger of said first and second partial path metrics for each state.

29. An equaliser as claimed in claim 28, including memory means for storing the larger of the first and second partial path metrics for each state.

30. An equaliser as claimed in claim 29, including data symbol storage means for storing for each state either a first or a second symbol depending on which of the first and second partial path metric is the larger.

31. An equaliser as claimed in claim 30, including means for reading from the data symbol storage means an estimate of the most likely sequence of transmitted data symbols.

32. An equaliser as claimed in claim 17, including means for generating information indicative of the relative confidence level of each estimated data symbol.

33. A decoding arrangement for decoding a convolutionally encoded data signal, comprising: a maximum likelihood (ML) detector for estimating a data symbol in a sequence of transmitted data symbols received over a communication channel, wherein a plurality of different states is associated with the transmission of said data symbols, the ML detector comprising:
   a plurality of data sources relating respectively to state transition probabilities and observed values of received data symbols, and
   means for calculating partial path metrics for each state using values from said data sources for enabling an estimation of a received data symbol to be accomplished for decoding a convolutionally encoded data symbol, wherein
   the calculating means comprise common add/accumulate means having respective inputs from each of said plurality of data sources for performing repeated additive arithmetic operations and for storing a cumulative result thereof, and
   multiplexing means are provided for selectively coupling said data sources in a predetermined order to said common add/accumulate means to implement a partial path metric calculation.

34. A decoding arrangement as claimed in claim 33, wherein the data sources relating to state transition probabilities include data sources relating respectively to previous partial path metrics and to branch metrics.

35. A decoding arrangement as claimed in claim 34, including a further data source for outputting terms that represent a characteristic of the communication channel, and means for calculating the branch metrics using values from said further data source and from the data source relating to the observed values of the received data symbols, wherein the branch metric calculating means comprise said common add/accumulate means, the multiplexing means being adapted for selectively coupling said data sources in a predetermined order to said common add/accumulate means to implement the branch metric calculations.

36. A decoding arrangement as claimed in claim 33, wherein the data sources comprise memory means for storing the state transition probabilities.

37. A decoding arrangement as claimed in claim 33, wherein the data sources include memory means for storing observed values of the received data symbols.

38. A decoding arrangement as claimed in claim 33, wherein the predetermined order in which the multiplexing means couples the data sources to the add/accumulate means is such that for each state at a given time a first partial path metric is calculated in respect of a state transition corresponding to the transmission of a first symbol type, and subsequently a second partial path metric is calculated in respect of a state transition corresponding to the transmission of a second symbol type, means being provided for storing said first partial path metric, the detector further including means for comparing the first partial path metric in the storage means and the second partial path metric in the add/accumulate means and for selecting the larger of said first and second partial path metrics for each state in turn.

39. A decoding arrangement as claimed in claim 38, including memory means for storing the larger of the first and second partial path metrics for each state.

40. A decoding arrangement as claimed in claim 39, including data symbol storage means for storing for each state either a first or a second symbol depending on which of the first and second partial path metric is the larger.

41. A decoding arrangement as claimed in claim 40, including means for reading from the data symbol storage means an estimate of the most likely sequence of transmitted data symbols.

42. A decoding arrangement as claimed in claim 33, wherein the calculating means comprises a first add/accumulate means for calculating for each state in turn a first partial path metric in respect of a state transition corresponding to the transmission of a first symbol type, and a second add/accumulate means for calculating for each state in turn a second partial path metric in respect of a state transition corresponding to the transmission of a second symbol type.

43. A decoding arrangement as claimed in claim 42, wherein said first and second add/accumulate means are arranged to operate in parallel.

44. A decoding arrangement as claimed in claim 42, including means for comparing the first and second partial path metrics in said first and second add/accumulate means respectively and for selecting the larger of said first and second partial path metrics for each state.

45. A decoding arrangement as claimed in claim 44, including memory means for storing the larger of the first and second partial path metrics for each state.

46. A decoding arrangement as claimed in claim 45, including data symbol storage means for storing for each state either a first or a second symbol depending on which of the first and second partial path metric is the larger.

47. A decoding arrangement as claimed in claim 46, including means for reading from the data symbol storage means an estimate of the most likely sequence of transmitted data symbols.

48. A decoding arrangement as claimed in claim 33, including means for generating information indicative of the relative confidence level of each estimated data symbol.

49. An arrangement for receiving a convolutionally encoded signal transmitted over a dispersive communications channel, comprising:
   equalising means having an input for receiving the convolutionally encoded signal for equalising the convolutionally encoded signal; and
   decoding means for subsequently decoding the equalised convolutionally encoded signal, wherein the equalising means and the decoding means are each comprised of a same maximum likelihood (ML) detector that is utilized by both the equalising means and decoding means for estimating received data symbols in the received convolutionally encoded signal, wherein the common ML detector comprises:
   a plurality of data sources relating respectively to state transition probabilities and observed values of the received data symbols, and
   means for calculating partial path metrics for each state using values from said data sources, wherein the calculating means comprise common add/accumulate means having respective inputs from each of said plurality of data sources for performing repeated additive arithmetic operations and for storing a cumulative result thereof, and
   multiplexing means for provided for selectively coupling said data sources in a predetermined order to said add/accumulate means to implement a partial path metric calculation.

50. An arrangement for receiving a convolutionally encoded signal as claimed in claim 49, wherein the data sources relating to state transition probabilities include data sources relating respectively to previous partial path metrics and to branch metrics.

51. An arrangement for receiving a convolutionally encoded signal as claimed in claim 50, including a further data source for outputting terms that represent a characteristic of the communication channel, and means for calculating the branch metrics using values from said further data source and from the data source relating to the observed values of the received data symbols, wherein the branch metric calculating means comprise said common add/accumulate means, the multiplexing means being adapted for selectively coupling said data sources in a predetermined order to said common add/accumulate means to implement the branch metric calculations.

52. An arrangement for receiving a convolutionally encoded signal as claimed in claim 49, wherein the data sources comprise memory means for storing the state transition probabilities.

53. An arrangement for receiving a convolutionally encoded signal as claimed in claim 49, wherein the data sources include memory means for storing observed values of the received data symbols.

54. An arrangement for receiving a convolutionally encoded signal as claimed in claim 49, wherein the predetermined order in which the multiplexing means couples the data sources to the add/accumulate means is such that for each state at a given time a first partial path metric is calculated in respect of a state transition corresponding to the transmission of a first symbol type, and subsequently a second partial path metric is calculated in respect of a state transition corresponding to the transmission of a second symbol type, means being provided for storing said first partial path metric, the detector further including means for comparing the first partial path metric in the storage means and the second partial path metric in the add/accumulate means and for selecting the larger of said first and second partial path metrics for each state in turn.

55. An arrangement for receiving a convolutionally encoded signal as claimed in claim 54, including memory means for storing the larger of the first and second partial path metrics for each state.

56. An arrangement for receiving a convolutionally encoded signal as claimed in claim 55, including data symbol storage means for storing for each state either a first or a second symbol depending on which of the first and second partial path metric is the larger.

57. An arrangement for receiving a convolutionally encoded signal as claimed in claim 56, including means for reading from the data symbol storage means an estimate of the most likely sequence of transmitted data symbols.

58. An arrangement for receiving a convolutionally encoded signal as claimed in claim 49, wherein the calculating means comprises a first add/accumulate means for calculating for each state in turn a first partial path metric in respect of a state transition corresponding to the transmission of a first symbol type, and a second add/accumulate means for calculating for each state in turn a second partial path metric in respect of a state transition corresponding to the transmission of a second symbol type.

59. An arrangement for receiving a convolutionally encoded signal as claimed in claim 58, wherein said first and second add/accumulate means are arranged to operate in parallel.

60. An arrangement for receiving a convolutionally encoded signal as claimed in claim 58, including means for comparing the first and second partial path metrics in said first and second add/accumulate means respectively and for selecting the larger of said first and second partial path metrics for each state.

61. An arrangement for receiving a convolutionally encoded signal as claimed in claim 60, including memory means for storing the larger of the first and second partial path metrics for each state.

62. An arrangement for receiving a convolutionally encoded signal as claimed in claim 61, including data symbol storage means for storing for each state either a first or a second symbol depending on which of the first and second partial path metric is the larger.

63. An arrangement for receiving a convolutionally encoded signal as claimed in claim 62, including means for reading from the data symbol storage means an estimate of the most likely sequence of transmitted data symbols.

64. An arrangement for receiving a convolutionally encoded signal as claimed in claim 49, including means for generating information indicative of the relative confidence level of each estimated data symbol.

* * * * *

UNITED STATES PATENT AND TRADEMARK OFFICE
CERTIFICATE OF CORRECTION

PATENT NO. : 5,375,129
DATED : Dec. 20, 1994
INVENTOR(S) : Cooper

It is certified that error appears in the above-indentified patent and that said Letters Patent is hereby corrected as shown below:

On title page, item [73]  Assignee should read —Nokia Mobile Phones (U.K.) Limited—

Signed and Sealed this

Twenty-ninth Day of August, 1995

Attest:

BRUCE LEHMAN

*Attesting Officer*         *Commissioner of Patents and Trademarks*